(12) United States Patent
Hsu

(10) Patent No.: US 6,853,544 B2
(45) Date of Patent: Feb. 8, 2005

(54) PROCESS FOR FORMING PRINTED CIRCUIT FILM USED IN WATERPROOF KEYBOARD

(76) Inventor: Fong Chi Hsu, 4F, No. 110, Chiao-Ho Rd., Chung-Ho City, Taipei Hsien (TW)

( * ) Notice: Subject to any disclaimer, the term of this patent is extended or adjusted under 35 U.S.C. 154(b) by 301 days.

(21) Appl. No.: 10/217,348

(22) Filed: Aug. 8, 2002

(65) Prior Publication Data

US 2003/0222051 A1 Dec. 4, 2003

(30) Foreign Application Priority Data

Jun. 3, 2002 (TW) .......................................... 91111813 A

(51) Int. Cl.$^7$ ............................................... G06F 1/16
(52) U.S. Cl. ........................ 361/680; 361/681; 361/682; 361/683
(58) Field of Search .................. 216/18; 235/145 R; 400/472, 691; 361/680–683

(56) References Cited

U.S. PATENT DOCUMENTS

| | | | | |
|---|---|---|---|---|
| 6,467,683 B2 | * | 10/2002 | Jun .......................... | 235/145 R |
| 6,542,355 B1 | * | 4/2003 | Huang ........................ | 361/680 |
| 6,664,901 B1 | * | 12/2003 | Yamada et al. ................ | 341/22 |
| 6,705,782 B2 | * | 3/2004 | Cheng ........................ | 400/472 |
| 2002/0063149 A1 | * | 5/2002 | Jun .......................... | 235/145 R |

* cited by examiner

Primary Examiner—Duy-Vu N. Deo
(74) Attorney, Agent, or Firm—J.C. Patents

(57) ABSTRACT

The present invention provides a process for forming a printed circuit film in a waterproof keyboard. A circuit layer and an insulation layer are provided. The circuit layer has a plurality of contacts and circuits electrically connected to the contacts. The contacts are located respectively corresponding to keys of a keyboard. The circuits are located respectively corresponding to the contacts. Then, the circuit layer is folded and then the insulation layer is interleaved between the folded circuit layer. Thereafter, the insulation layer is laminated with the circuit layer.

10 Claims, 11 Drawing Sheets

PROCESS FOR FORMING PRINTED CIRCUIT FILM USED IN WATERPROOF KEYBOARD

CROSS-REFERENCE TO RELATED APPLICATION

This application claims the priority benefit of Taiwan application serial no. 91111813, Jun. 3, 2002.

BACKGROUND OF THE INVENTION

1. Field of the Invention

The invention relates to a process for forming a waterproof keyboard. More specifically, the present invention relates to a process for forming a printed circuit film used in a waterproof keyboard.

2. Description of the Related Art

Notebooks have become widely used as portable computers. The different types of notebook include ultra thin type notebooks and all-in-one type notebooks. The notebook essentially consists of an input device, a monitor and a host. The input device is a human interface device (HID), such as mouse, keyboard, and writing/voice identification system. Most of the application programs are operated via the input device. In order to be more user-friendly, the current notebook is further designed more lightweight and more compact.

Additionally, the waterproof characteristic of the input device is also important, because it may extend the service life of the notebook. Within the keyboard of a conventional notebook, a waterproof coating is usually applied to a printed circuit film of the keyboard to protect circuits thereof from contacting with external moisture, water or liquid.

FIG. 1 is a schematic view showing a conventional process for manufacturing the printed circuit film of a waterproof keyboard. With reference to FIG. 1, the process includes a step S100 of forming a circuit layer, a step S102 of forming an insulation layer, a step S104 of applying a waterproof coating, a step S106 of laminating the insulation layer with the circuit layer, a step S108 of curing and a step S110 of punching.

At step S100, a circuit layer is formed via printing conductive patterns on a PET film. The conductive patterns include a plurality of circuits and contacts. At step S102, the insulation layer is formed via punching a PET film to form a plurality of openings respectively corresponding to the contacts of the circuit layer.

The waterproof coating is applied over the circuit layer or the insulation layer. The location of the waterproof coating corresponds to that of a positioning hole which is formed after the waterproof coating. Usually, the area of the waterproof coating is larger than a diameter of the positioning hole.

At step S106, the insulation layer is laminated with the circuit layer. FIG. 2 is a schematic view showing the conventional printed circuit film obtained by laminating the circuit layer on the insulation layer. With reference to FIG. 2, a circuit layer 200 is folded into a first circuit portion 200a and a second circuit portion 200b. An insulation layer 300 is interleaved between the first circuit portion 200a and the second circuit portion 200b. Then, the insulation layer is laminated with the circuit layer.

With reference to FIG. 2, the first circuit portion 200a and the second circuit portion 200b of the circuit layer 200 have layouts corresponding to each other. On the first circuit portion 200a are formed a plurality of contacts 202a that respectively correspond to the keys of the keyboard, and a plurality of circuits 204a that respectively electrically connect the contacts 202a. On the second circuit portion 200b are formed a plurality of contacts 202b respectively corresponding to the contacts 202a, and a plurality of circuits 204b respectively corresponding to the contacts 202b. The insulation layer 300 has a plurality of openings 302 that respectively correspond to the contacts 202a and 202b.

After the insulation layer 300 is laminated with the circuit layer 200, the contacts 202a and 202b are located inside the opening 302 of the insulation layer 200. When a key of the keyboard and the first circuit portion 200a are pressed down, the contact 202a on the first circuit portion 200a is electrically connected to the contact 202b on the second circuit portion 200b, thereby achieving information input.

With reference to FIG. 1, after step S106 where the insulation layer is laminated with the circuit layer, the waterproof coating is cured in step S108. Infrared ray radiation is usually used to cure the waterproof coating. Finally, the cured layers including the first circuit portion 200a, the insulation layer 300 and the second circuit portion 200b are punched to form a plurality of positioning holes that have locations and sizes respectively corresponding to a positioning mechanism of the keyboard.

FIGS. 3A to 3D are schematic views showing how a conventional circuit layer is formed. With reference to FIG. 3A, a circuit layer is provided. The circuit layer has a first circuit portion 200a and a second circuit portion 200b. The first portion 200a has a plurality of contacts 202a and a plurality of circuits (not shown) thereon. The second circuit portion 200b has a contact 202b and circuit (not shown) thereon. The insulation layer 300 includes a plurality of openings 302. A waterproof coating 400 is applied over a predetermined area of the insulation layer 300 where the first circuit portion 200a, the insulation layer 300, and the second portion 200b are positioned such that the contacts 202a and 202b are thereby located inside the opening 302.

With reference to FIG. 3A, after the waterproof coating is applied, the first circuit portion 200a is laminated with insulation layer 300 and second circuit portion 200b to form a multi-layered film. The contacts 202a and 202b are located inside the openings 302.

With reference to FIG. 3C, after the lamination process, the waterproof coating between the first and second circuit portions is cured by IR. Thereby, a waterproof property is achieved.

With reference to FIG. 3D, after the step S108 of curing, a punching process is performed to form a plurality of positioning holes 402. The area where the waterproof coating is applied corresponds to and covers the locations of the positioning holes 402. Therefore, the waterproof coating 400 prevents moisture, water or liquid from penetrating into the multi-layered film through sidewalls of the positioning holes 402.

FIG. 4 is a schematic view showing the positioning holes and the waterproof coating of the conventional printed circuit film. As shown, the waterproof coating 400 is not completely removed after the punching process is performed to form the positioning holes 402. FIG. 3D is cross-sectional view taken along line I—I of FIG. 4.

In the conventional process for manufacturing the printed circuit film in a waterproof keyboard, the waterproof coating is applied between the circuit layer and the insulation layer. After the lamination process, the distribution of the waterproof coating therefore is not easily controlled. Moreover, the waterproof coating has to be cured by irradiating with IR after the lamination.

SUMMARY OF THE INVENTION

It is one object of the invention to provide a process for manufacturing a printed circuit film of a waterproof keyboard, in which the printed circuit film is subject to a water proofing treatment by laser welding to form a plurality of waterproof regions.

In order to achieve the above and other objectives of the invention, a process for manufacturing a printed circuit film of a waterproof keyboard is provided. First, a circuit layer and an insulation layer are provided. The circuit layer includes a plurality of contacts respectively corresponding to a plurality of keys of the keyboard, and a plurality of circuits respectively connected to the contacts. The insulation layer includes a plurality of openings respectively corresponding to the contacts of the circuit layer. The circuit layer is folded and the insulation layer is interleaved between the folded circuit layer to laminate the circuit layer with the insulation layer. After the lamination process, a waterproofing treatment is performed by, for example, partially irradiating the circuit layer and the insulation layer with a laser to form a plurality of waterproof regions at proper locations. Then, the waterproof regions are punched to form a plurality of positioning holes.

The circuit layer is formed by providing a first base film, and printing conductive patterns on the first base film. The conductive patterns respectively have contacts and circuits electrically connected to the contacts. The first base film is made of PET, for example. An example of a material used to form the conductive patterns includes silver paste.

The insulation layer is formed by, for example, providing a second base film and punching the second base film to form a plurality of openings respectively corresponding to the contacts of the circuit layer. The second base film can be made of, for example PET.

In one aspect of the invention, the waterproofing treatment includes projecting a laser beam having a focus point. The focus point of the laser beam partially welds the circuit layer and the insulation layer.

In another aspect of the invention, the waterproofing treatment includes providing a mask on the circuit layer and then exposing the circuit layer with a laser that has a focus line. The mask has a plurality of openings through which a portion of the circuit layer is exposed. The exposed circuit layer is subsequently irradiated with the laser beam having a focus line to weld the circuit layer and the insulation layer together.

In the invention, the focus line of the laser beam sweeps in a predetermined direction. Thereby, the laser welding efficiency during the waterproofing treatment is improved, and the throughput is significantly increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principle of the invention. In the drawings.

DETAILED DESCRIPTION OF THE EMBODIMENTS

Reference will now be made in detail to the present preferred embodiments of the invention, examples of which are illustrated in the accompanying drawings. Whenever possible, the same reference numbers are used in then drawings and the description to refer to the same or like parts.

Figure 1:
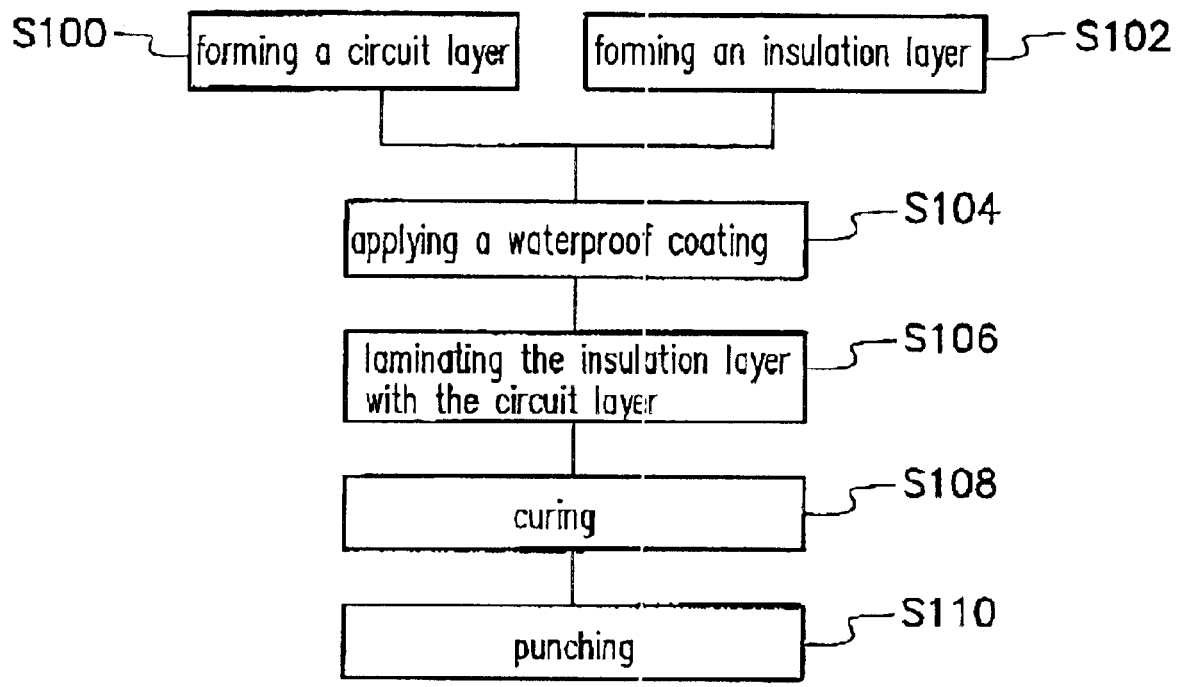
FIG. 1 is a schematic view showing a conventional process for manufacturing a printed circuit film in a waterproof keyboard.
Figure 2:
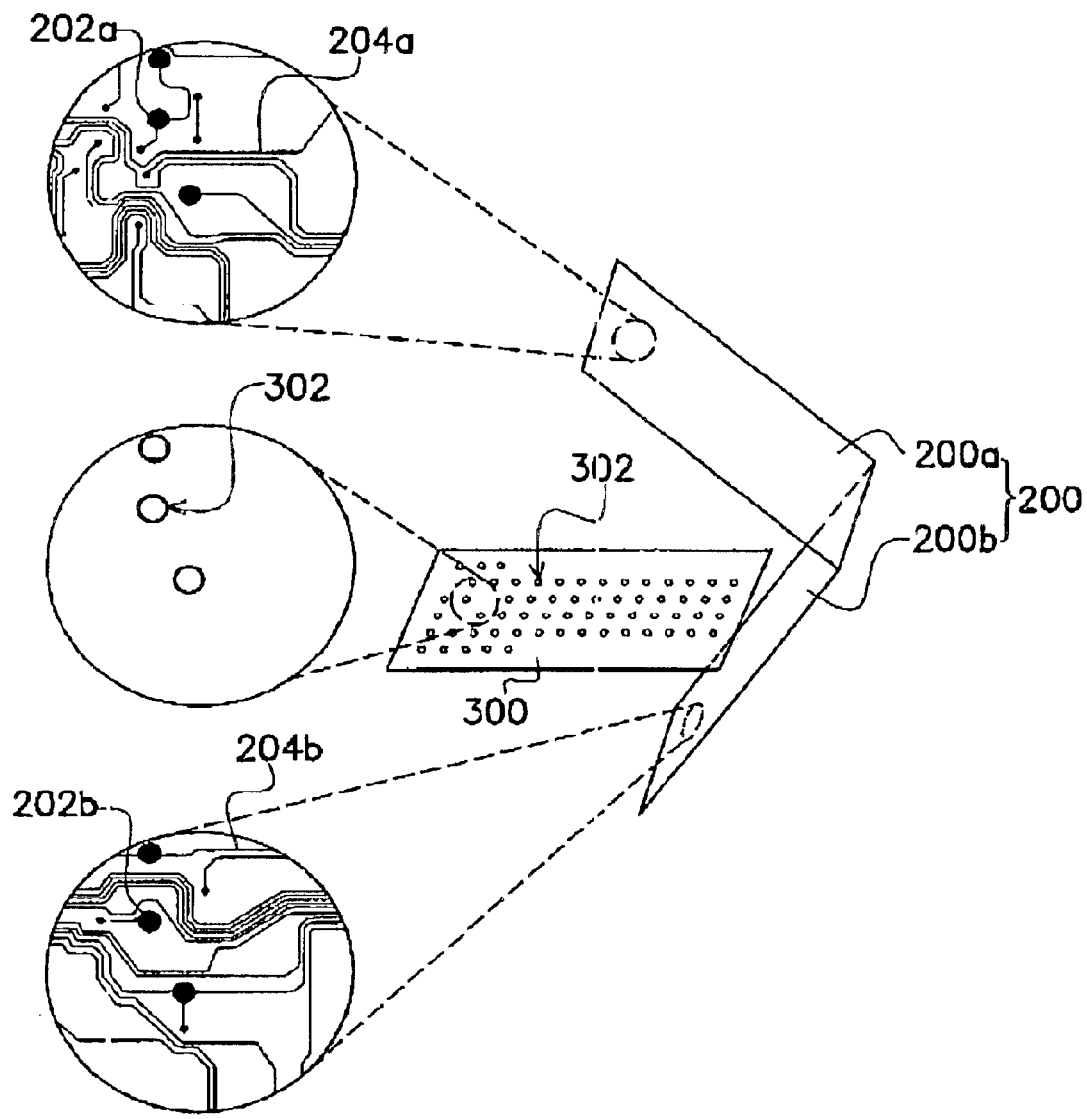
FIG. 2 is a schematic view of a conventional printed circuit film formed by laminating a circuit layer with an insulation layer.
Figure 3A:
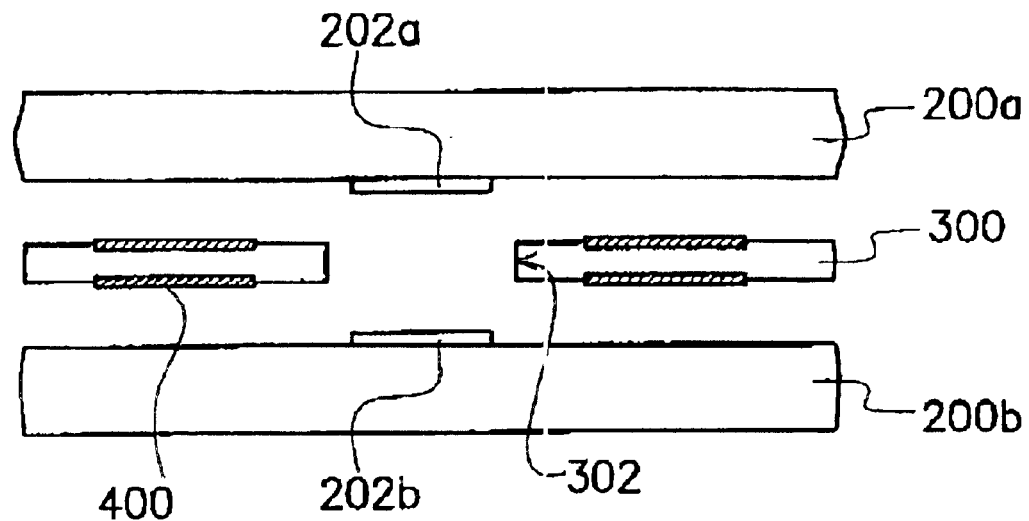
FIGS. 3A to 3D are schematic views showing the manufacture of a conventional printed circuit film.
Figure 3B:
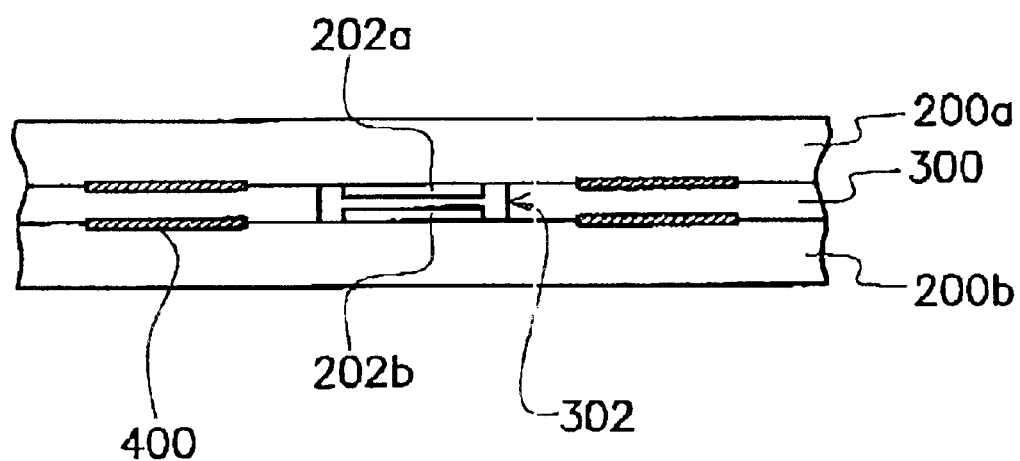
Figure 3C:
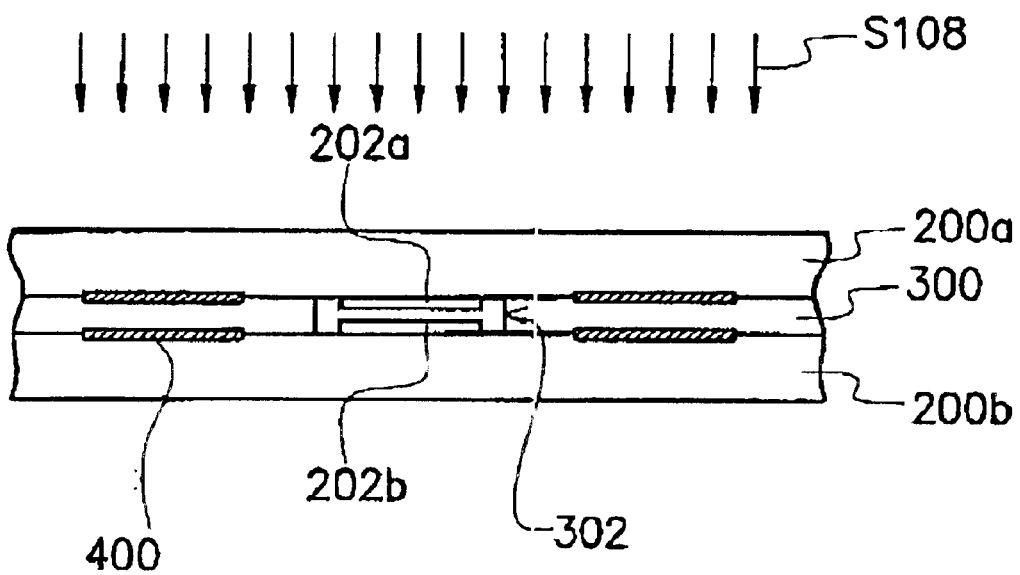
Figure 3D:
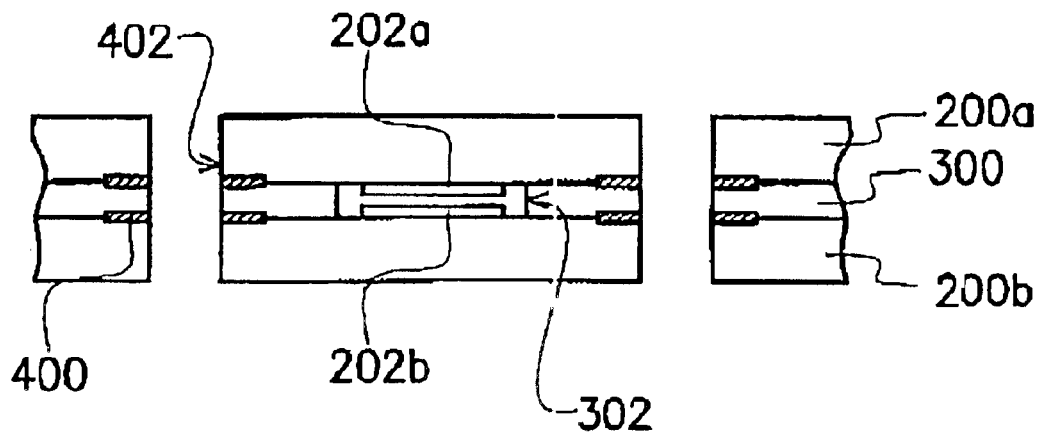
Figure 4:
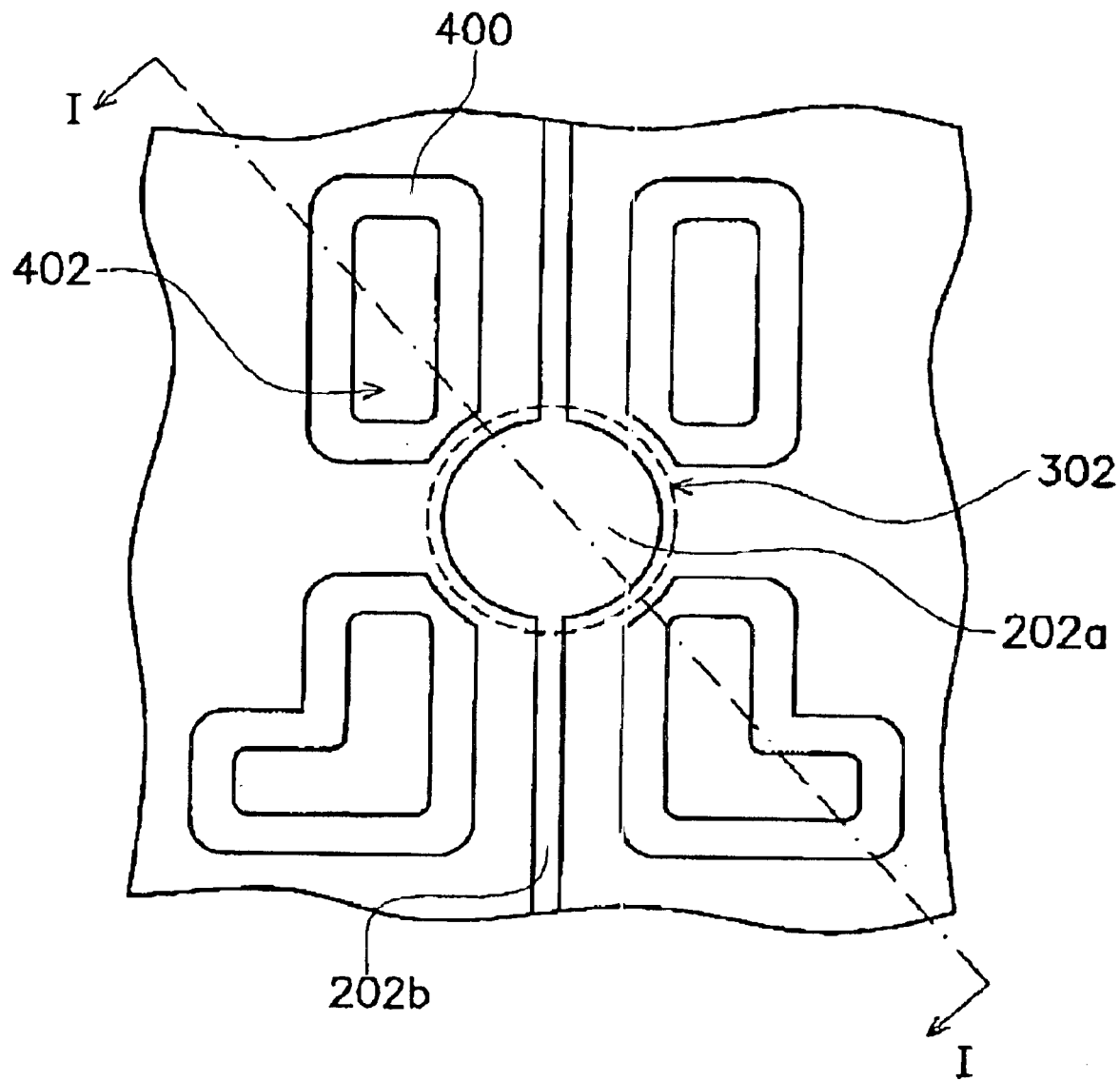
FIG. 4 is a schematic view showing a positioning hole and a waterproof coating on a conventional printed circuit film.
Figure 5:
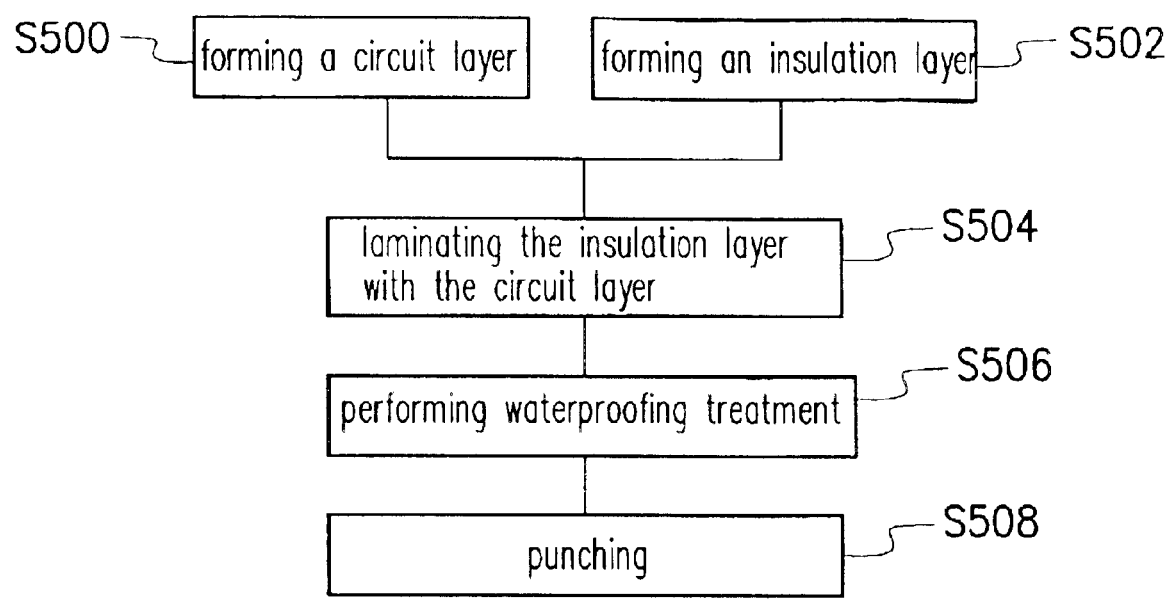
FIG. 5 is a flow chart showing a method of forming a printed circuit film used in a waterproof keyboard according to a preferred embodiment of the present invention.

FIG. 5 is a flow chart showing a method of manufacturing a printed circuit film used in a waterproof keyboard according to one preferred embodiment of the present invention. The method of the present invention includes the steps of forming a circuit layer (S500), forming an insulation layer (S502), laminating the insulation layer with the circuit layer (S504), performing a waterproofing treatment (S506) and punching (S508).

At step S500, a circuit layer is formed via first base film forming conductive patterns on a first base film. The conductive patterns respectively include contacts and circuits electrically connected to the contacts. Forming the conductive patterns on the first base film can be achieved by printing. At step S502, an insulation layer is formed second base film by punching a second base film to form a plurality of openings respectively corresponding to the contacts of the circuit layer.

Figure 6:
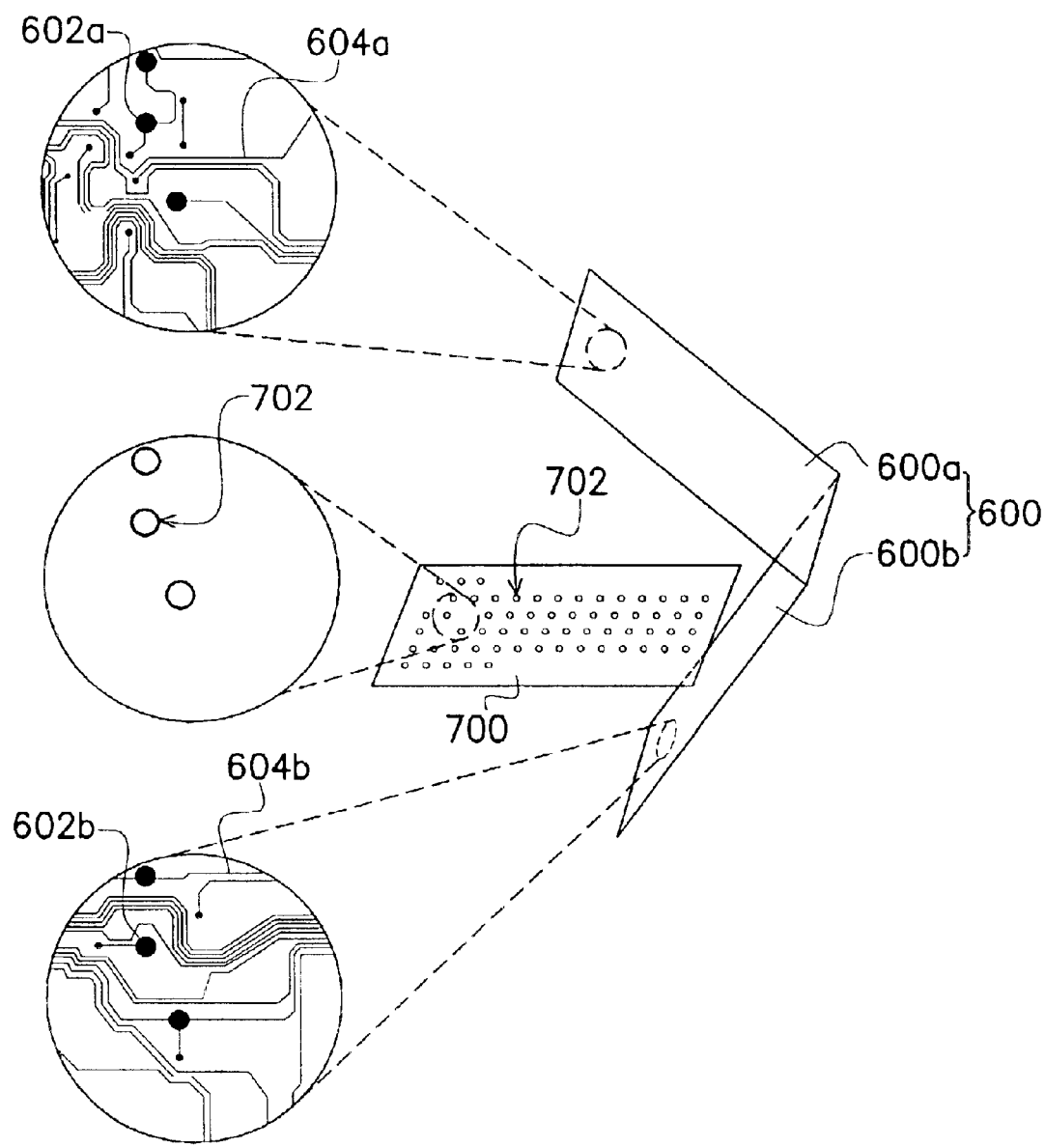
FIG. 6 is schematic view showing a printed circuit film obtained by stacking the circuit layer on the insulation layer according to one preferred embodiment of the present invention.

At step S504, the insulation layer then is laminated with the circuit layer. Prior to lamination, the circuit layer is stacked on the insulation layer. FIG. 6 is a schematic view showing a printed circuit film obtained by stacking the circuit layer on the insulation layer according to one preferred embodiment of the present invention. With reference to FIG. 6, a circuit layer 600 is folded into a first circuit portion 600*a* and a second circuit portion 600*b*. An insulation layer 700, formed as described above, is interleaved between the first circuit portion 600*a* and the second circuit portion 600*b*. The insulation layer then is laminated with the circuit layer.

With reference to FIG. 6, the first circuit portion 600*a* and the second circuit portion 600*b* have conductive patterns corresponding to each other. On the first circuit portion 600a are formed a plurality of contacts 602a that respectively correspond to the keys of the keyboard, and a plurality of circuits 604a that respectively electrically connect the contacts 602a. On the second circuit portion 600b are formed a plurality of contacts 602b that respectively correspond to the contacts 602a, and a plurality of circuits 602b that respectively correspond to the contacts 602b. Formed by step S502, the insulation layer 700 is provided with a plurality of openings 702 that respectively correspond to the contacts 602a and 602b.

After the insulation layer 700 is laminated with the circuit layer 600, each of the contacts 602a and 602b are located inside each of the openings 702 of the insulation layer 700. When the key and thus the first circuit portion 600a is pressed down, the contact 602a on the first circuit portion 600a is electrically connected to the contact 602b on the second circuit portion 600b to achieve information input.

With reference to FIG. 5, following step S504, a waterproofing treatment is performed by laser-welding method at step S506. Finally, a punch process is performed to form a plurality of positioning holes that have locations and sizes respectively corresponding to a positioning mechanism of the keys of the keyboard.

Figure 7A:
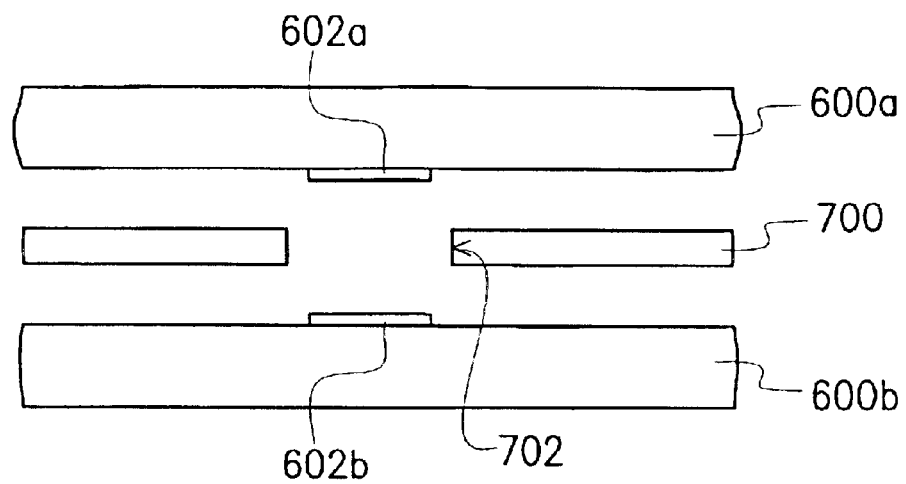
FIGS. 7A to 7E are schematic views showing the manufacture of a circuit layer according to one preferred embodiment of the present invention.

FIGS. 7A to 7E are schematic views showing the manufacture of a circuit layer according to one embodiment of the present invention. With reference to FIG. 7A, a circuit layer is provided. The circuit layer has a first circuit portion 600a and a second circuit portion 600b. The first circuit portion 600a includes a plurality of contacts 602a and a plurality of circuits (not shown) thereon. The second circuit portion 600b includes a plurality of contacts 602b and circuits (not shown) thereon. The insulation layer 700 having a plurality of openings 702 is provided.

Figure 7B:
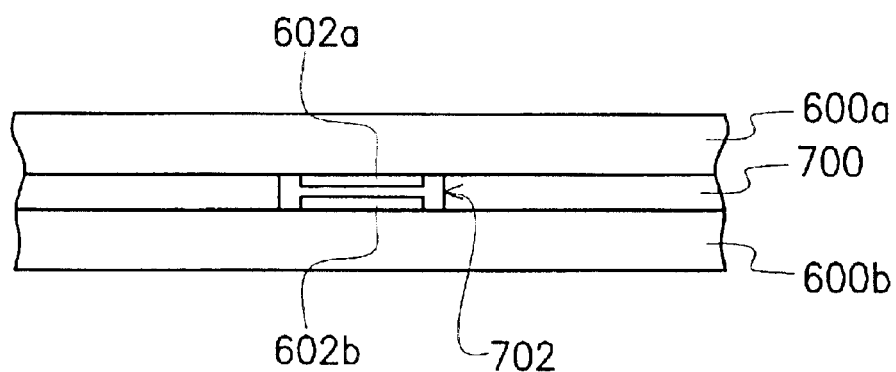

With reference to FIG. 7B, the first circuit portion 600a is laminated with both insulation layer 700 and second circuit portion 600b to form a multi-layered film. Thereafter, one of the contacts 602a and the corresponding one among contacts 602b, spaced away from each other, are located inside one of the openings 702.

Figure 7C:
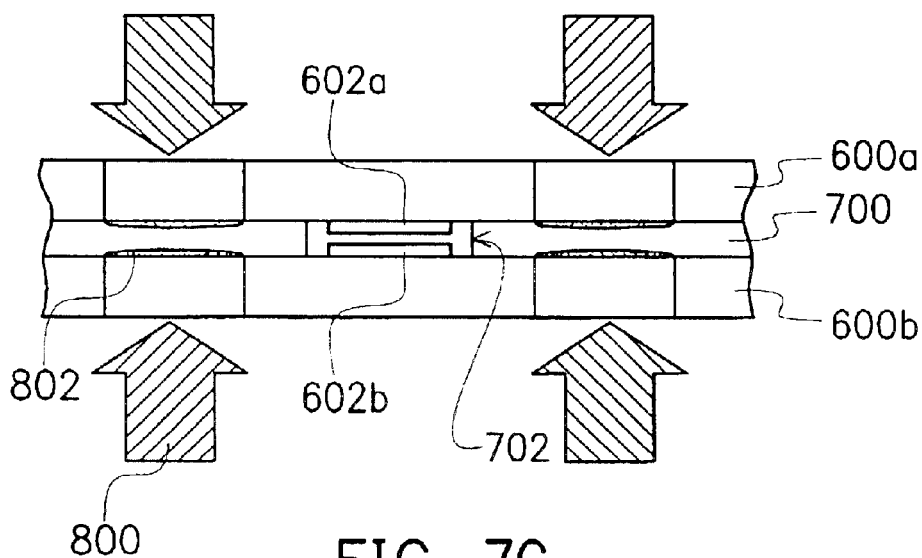

With reference to FIG. 7C, after the lamination process, a waterproofing treatment is performed using a laser 800. The laser can be $CO_2$ laser, Nd:YAG laser, and diode laser, for example. The he laser may produce a laser beam having a focus point or a focus line.

Figure 7D:
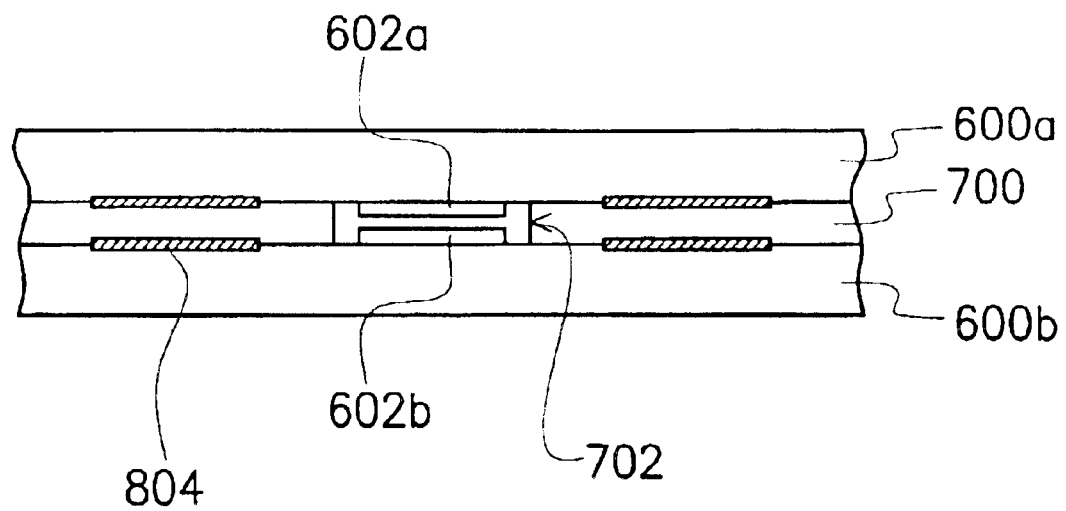

With reference to FIG. 7C and FIG. 7D, when the laser 800 irradiates the interface between the first circuit portion 600a and the insulation layer 700, the first circuit portion 600a and the insulation layer 700 are welded together at a melt region 802. Also, the laser beam 800 partially irradiates an interface between the second circuit portion 600b and the insulation layer 700 to bond the second circuit portion 600b and the insulation layer 700. The area irradiated with the laser beam 800 is designated a melt region 802. The melt region 802 then is cooled down. After having been cooled, the melt region 802 has an excellent waterproof property and is designated a waterproof region 804.

Figure 7E:
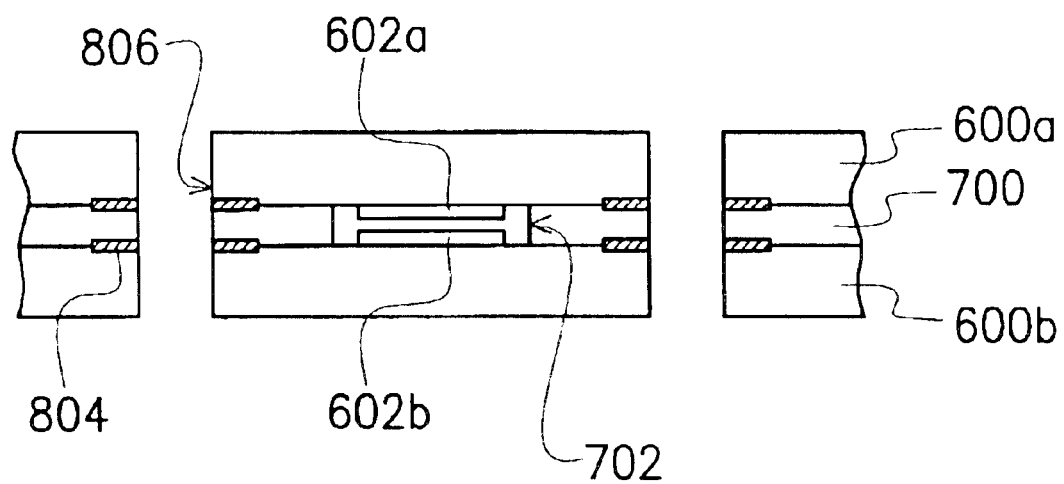

With reference to FIG. 7E, a punch process is performed to form a positioning hole 806. The waterproof region 804 corresponds to the positioning hole 806 and has a size larger than the positioning hole 806. After punching, the waterproof region 804 can prevent moisture and liquid penetration in the printed circuit film.

Figure 8:
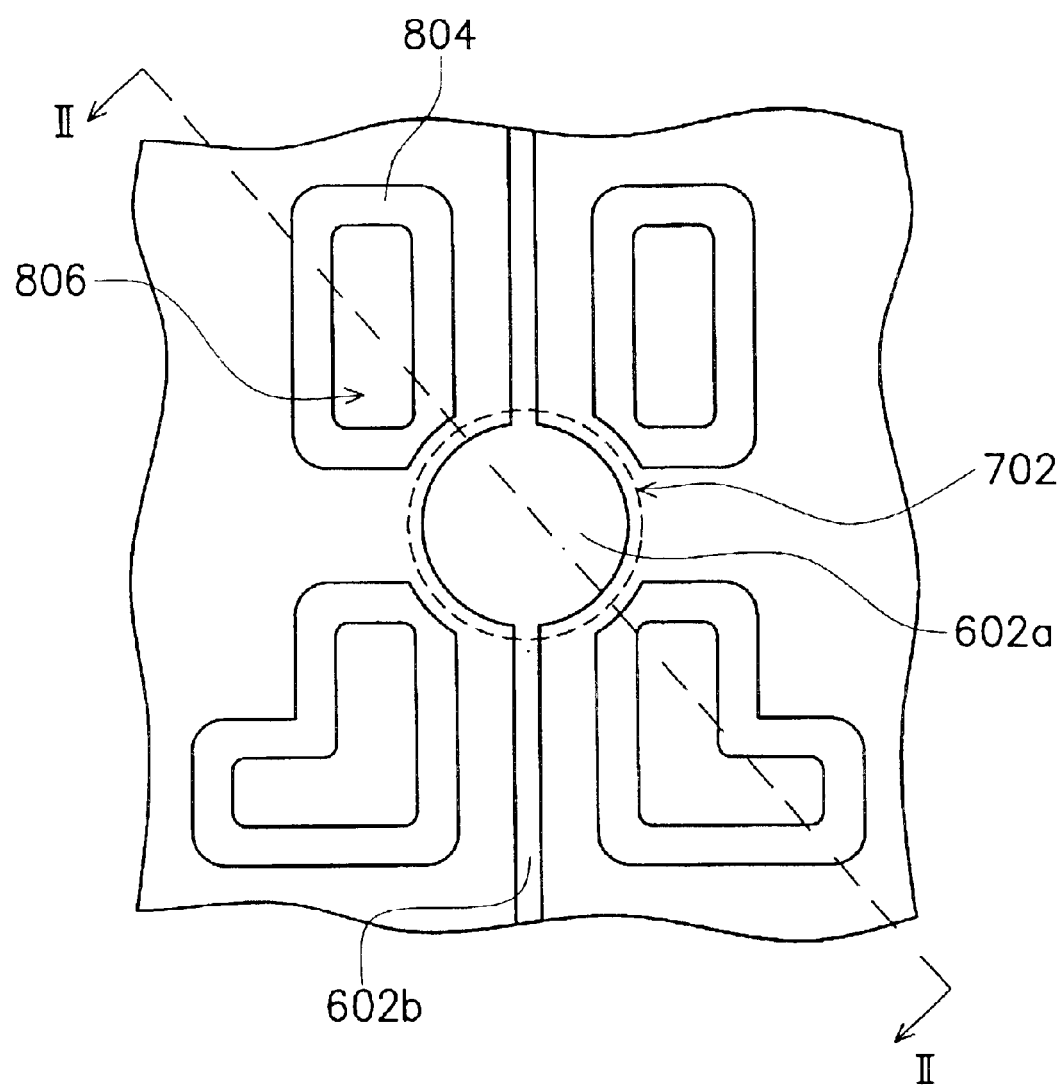
FIG. 8 is a schematic view of the waterproof regions and the positioning region of a printed circuit film according to one preferred embodiment of the present invention.

FIG. 8 is a schematic view of the waterproof region and the positioning region of a printed circuit film according to one preferred embodiment of the present invention. As shown, the waterproof region 804 surrounds the positioning hole 806. FIG. 7E is a schematic cross-sectional view taken along line II—II of FIG. 8.

Figure 9A:
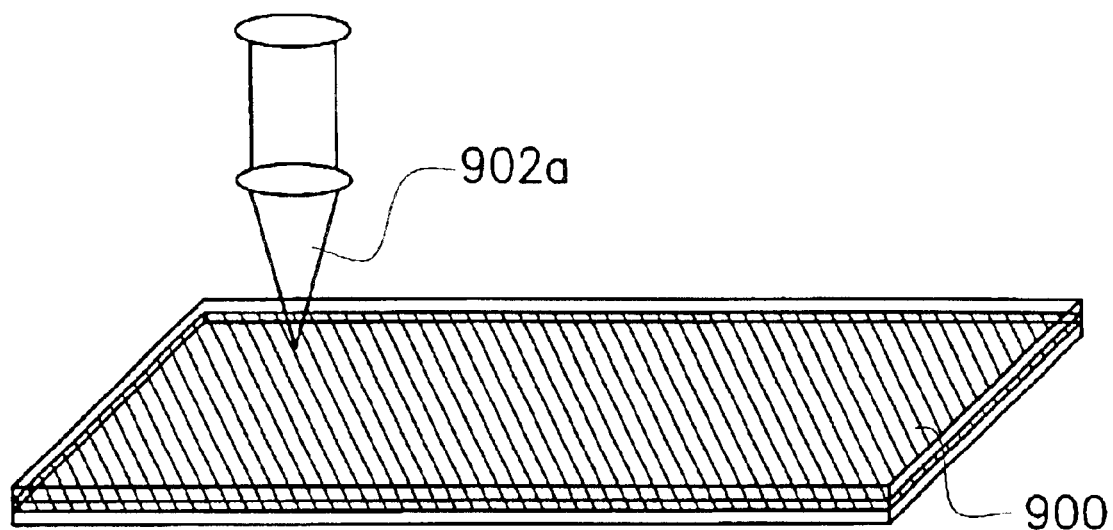
FIG. 9A and FIG. 9B are schematic views showing a laser welding process according to one preferred embodiment of the present invention.
Figure 9B:
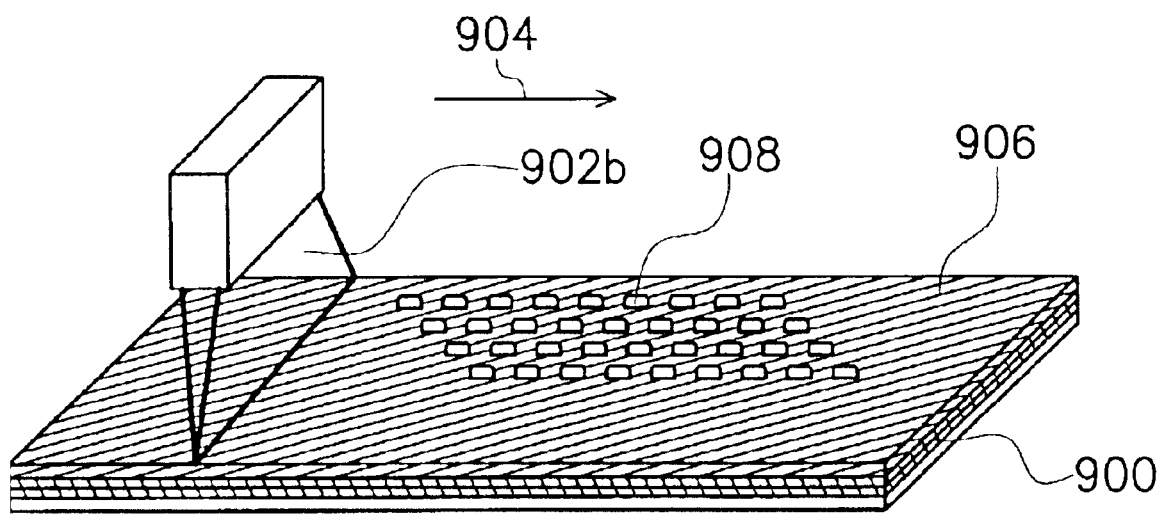

FIG. 9A and FIG. 9B are schematic views showing a laser-welding treatment according to one preferred embodiment of the present invention. As shown in FIG. 9A, the laser welding is performed by using a focus point 902a of laser beam.

As shown in FIG. 9B, laser welding may be alternatively performed by generating a focus line 902b of laser beam. A mask 906 is placed on the printed circuit film 900. The mask 906 has a plurality of openings 908. The openings 908 correspond to locations where the waterproof regions are to be formed on the printed circuit film. Then, the focus line 902b sweeps the printed circuit film 900 exposed by the openings 908 along a direction 904. This process greatly improves the throughput.

In view of foregoing, the process for manufacturing a printed circuit film used in a waterproof keyboard according to the present invention has at least the following advantages:

1. The waterproof coating is not needed in the process of the present invention. The difficult control of applying the waterproof coating is therefore overcome.

2. The laser welding method is used as waterproofing treatment of the printed circuit film.

3. The mask is used to define the area that is subject to laser welding, which thereby substantially improves the throughput.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A process for manufacturing a printed circuit film used in a waterproof keyboard, the process comprising:

forming a circuit layer, wherein the circuit layer has a plurality of contacts and a plurality of circuits respectively connected to the contacts;

forming an insulation layer, wherein the insulation layer has a plurality of first openings respectively corresponding to the contacts;

laminating the circuit layer with the insulation layer;

performing a waterproofing treatment by partially irradiating the circuit layer and the insulation layer with a laser beam to form a plurality of waterproof regions; and punching the waterproof regions to form a plurality of positioning holes.

2. The process of claim 1, wherein the step of forming the circuit layer further comprises: forming a first base film; and forming a plurality of conductive patterns on the first base film, wherein the conductive patterns comprise the contacts and the circuits electrically connected to the contacts.

3. The process of claim 2, wherein the material used to form the first base film includes PET.

4. The process of claim 2, wherein the material used to form the conductive patterns includes silver paste.

5. The process of claim 1, wherein the step of forming the insulation layer further comprises: forming a second base film; and punching the second base film to form a plurality of openings.

6. The process of claim 5, wherein the material used to form the second base film includes PET.

7. The process of claim 1, further comprising folding the circuit layer and interleaving the insulation layer between the folded circuit layer before laminating the circuit layer with the insulation layer.

8. The process of claim 1, wherein the waterproofing treatment further comprises:

providing a laser beam having a focus point; and welding a portion of the circuit layer and a portion of the insulation layer by means of the laser beam to form the waterproof regions.

9. The process of claim 1, wherein the waterproofing treatment further comprises:

providing a mask having a plurality of second openings over the circuit layer, wherein the openings expose a portion of the circuit layer and respectively correspond to the waterproof regions; and irradiating the circuit layer and the insulation layer with a laser beam through the second openings of the mask to form the waterproof regions, wherein the laser beam has a focus line.

10. The process of claim 9, wherein the laser beam sweeps the mask in a predetermined direction.

* * * * *